(12) United States Patent
Ibe et al.

(10) Patent No.: US 9,610,773 B2
(45) Date of Patent: Apr. 4, 2017

(54) METHOD FOR PRODUCING LIQUID-EJECTION-HEAD SUBSTRATE AND LIQUID-EJECTION-HEAD SUBSTRATE PRODUCED BY THE SAME

(71) Applicant: CANON KABUSHIKI KAISHA, Tokyo (JP)

(72) Inventors: Satoshi Ibe, Yokohama (JP); Keiji Watanabe, Kawasaki (JP); Junya Hayasaka, Funabashi (JP); Shiro Sujaku, Kawasaki (JP); Kouji Hasegawa, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/013,780

(22) Filed: Feb. 2, 2016

(65) Prior Publication Data

US 2016/0229184 A1    Aug. 11, 2016

(30) Foreign Application Priority Data

Feb. 5, 2015   (JP) .................................. 2015-021653

(51) Int. Cl.
*B41J 2/14*   (2006.01)
*B41J 2/16*   (2006.01)
*H05K 3/36*   (2006.01)

(52) U.S. Cl.
CPC ......... *B41J 2/1607* (2013.01); *B41J 2/14072* (2013.01); *B41J 2/14201* (2013.01); *B41J 2/1603* (2013.01); *B41J 2/1626* (2013.01); *B41J 2/1631* (2013.01); *B41J 2/1645* (2013.01); *H05K 3/361* (2013.01); *B41J 2002/14491* (2013.01)

(58) Field of Classification Search
CPC .................. B41J 2/1607; B41J 2/14201; B41J 2002/14491; B41J 2/1603; B41J 2/1626; B41J 2/1645; B41J 2/14072; H05K 3/361; H05K 3/225
See application file for complete search history.

(56) References Cited

U.S. PATENT DOCUMENTS

| 5,113,566 A * | 5/1992 | Weekamp | H01L 41/293 29/25.35 |
| 2009/0166079 A1* | 7/2009 | Hatanaka | H01L 21/486 174/262 |
| 2011/0061715 A1* | 3/2011 | Fujibayashi | C23C 16/407 136/244 |

FOREIGN PATENT DOCUMENTS

JP     2010-221656 A * 10/2010 ................ B41J 2/05

* cited by examiner

*Primary Examiner* — Manish S Shah
*Assistant Examiner* — Yaovi M Ameh
(74) *Attorney, Agent, or Firm* — Canon U.S.A. Inc., IP Division

(57) ABSTRACT

A method for producing a liquid-ejection-head substrate includes providing a substrate having an energy-generating element and a pad, the pad including a wiring layer, the wiring layer in the pad having a relatively thick portion and a relatively thin portion and performing electrical inspection by applying a contact probe to the relatively thin portion of the wiring layer in the pad.

13 Claims, 2 Drawing Sheets

METHOD FOR PRODUCING LIQUID-EJECTION-HEAD SUBSTRATE AND LIQUID-EJECTION-HEAD SUBSTRATE PRODUCED BY THE SAME

BACKGROUND OF THE INVENTION

Field of the Invention

The present invention relates to a method for producing a liquid-ejection-head substrate and to a liquid-ejection-head substrate produced by the method.

Description of the Related Art

Liquid ejecting devices, such as ink jet printing devices, include a liquid-ejection head. The liquid ejection head is provided with a liquid-ejection-head substrate, called a chip or the like. The liquid-ejection-head substrate includes an energy-generating element, such as a heating resistor or a piezoelectric element. The energy-generating element energizes liquid to cause ejection of the liquid. In such a liquid-ejection-head substrate, a flow channel and a liquid chamber are formed on a substrate formed of silicon or the like and an energy-generating element is disposed in the liquid chamber. On the substrate, the energy-generating element is connected to a wiring layer and an end of the wiring layer functions as a pad. The pad is connected to a power supply provided outside the liquid-ejection-head substrate via external wiring, such as by bonding. The energy-generating element in the liquid-ejection-head substrate is driven by supplying electricity from the outside of the liquid-ejection-head substrate via the pad.

The pad includes a wiring layer formed of aluminum or the like and a bump section formed of gold or the like. A process for producing a liquid-ejection-head substrate may involve electrically inspecting a semiconductor integrated circuit in the wiring layer in the pad by using a contact probe. In this electrical inspection, the contact probe is brought into contact with the surface of the wiring layer in such a manner that the wiring layer is scrubbed with the contact probe. At this time, an insulating film, such as a naturally oxidized film, and the wiring layer formed of aluminum or the like are scrubbed with the contact probe, forming a protruding electrical inspection mark on the wiring layer in the pad. Even after subsequent washing, such a protruding electrical inspection mark remains on the pad. For example, when an organic material is stacked on the substrate, such an electrical inspection mark may reduce the thickness uniformity of a layer of the organic material. If the electrical inspection mark cannot be appropriately covered by a barrier metal layer formed after the electrical inspection, alloying may occur between the wiring layer (formed of, for example, aluminum) and a bump section (formed of, for example, gold) which are stacked with the barrier metal layer therebetween, and this alloying may decrease the function as an electrode.

Japanese Patent Laid-Open No. 2010-221656 describes that a plurality of stepped portions (slits) is formed in a region with which a contact probe is to be brought into contact and the plurality of stepped portions (slits) serves as a stopper layer and reduces formation of an electrical inspection mark on a wiring layer in a pad.

The method described in Japanese Patent Laid-Open No. 2010-221656 may reduce formation of an electrical inspection mark. However, according to the inventors' studies, the stopper layer may be damaged when the contact strength of a contact probe is high during electrical inspection, or when the stylus pressure applied to a first contact probe is high due to uneven lengths of contact probes. As a result, a protrusion (electrical inspection mark) may be formed on the wiring layer.

The size of the electrical inspection mark depends on the conditions of an inspection device. However, when the contact strength of a contact probe for scrubbing an insulating film is adjusted to reduce formation of the electrical inspection mark, the insulating film may be left, which may result in uneven resistance.

SUMMARY OF THE INVENTION

Therefore, the present invention provides a highly reliable liquid-ejection-head substrate in which formation of an electrical inspection mark on a pad surface is reduced.

The present invention provides a method for producing a liquid-ejection-head substrate including a substrate, an energy-generating element provided on the substrate and configured to energize liquid and cause ejection of the liquid, and a pad provided on the substrate and electrically connected to the energy-generating element. The method for producing a liquid-ejection-head substrate includes: providing the substrate having the energy-generating element and the pad, the pad including a wiring layer, the wiring layer in the pad having a relatively thick portion and a relatively thin portion; and performing electrical inspection by applying a contact probe to the relatively thin portion of the wiring layer in the pad.

Further features of the present invention will become apparent from the following description of exemplary embodiments with reference to the attached drawings.

DESCRIPTION OF THE EMBODIMENTS

Figure 1:
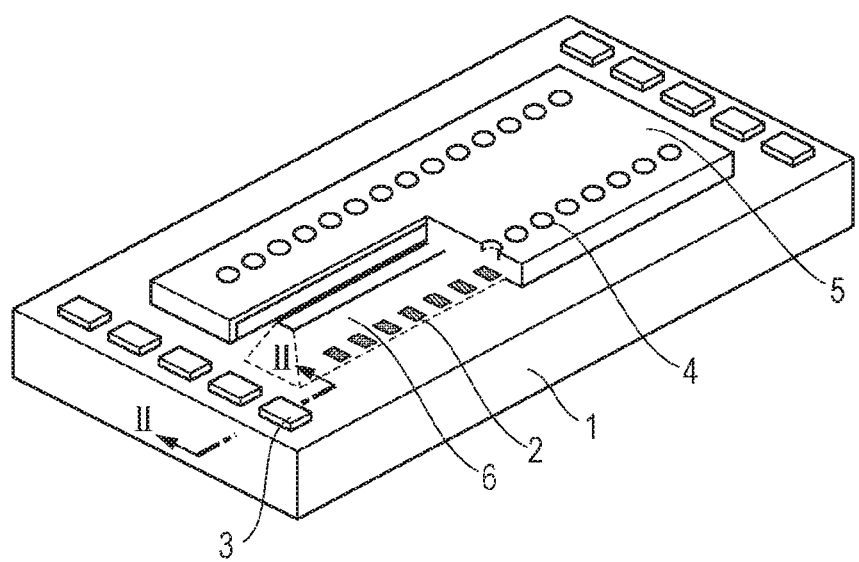
FIG. 1 is a perspective view of a liquid-election-head substrate.

FIG. 1 is a perspective view of a liquid-ejection-head substrate. The liquid-ejection-head substrate includes a substrate 1 formed of silicon or the like. The substrate 1 has thereon energy-generating elements 2 and pads 3 electrically connected to the energy-generating elements 2 via a wiring layer. On the substrate 1, a member 5 having a flow channel and ejection ports 4 for liquid is provided. The substrate 1 has a supply port 6. The liquid is supplied to the flow channel from the supply port 6. The liquid is ejected from the ejection ports 4 when the energy-generating elements 2 energize the liquid.

A method for producing the liquid-ejection-head substrate illustrated in FIG. 1 will be described with reference with a cross section taken along line II-II in FIG. 1. Although the energy-generating elements 2 are heating resistors herein, the energy-generating elements 2 may be for example, piezoelectric elements.

Figure 2A:
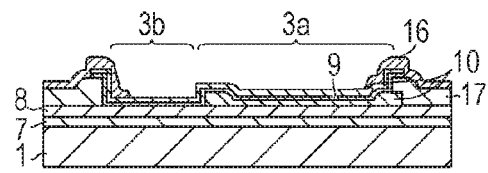
FIGS. 2A to 2K are views illustrating a method for producing the liquid-ejection-head substrate.

First, a substrate 1 as illustrated in FIG. 2A is provided. A first heat-accumulating layer 7 and a second heat-accumulating layer 8 are formed on the substrate 1. These heat-accumulating layers are formed of, for example, $SiO_2$. A pad including a heating resistor layer 9 formed of TaSiN or the like and a wiring layer 10 formed of aluminum is formed on the first heat-accumulating layer 7 and the second heat-accumulating layer 8. The wiring layer 10 in the pad has a relatively thick portion 3a and a relatively thin portion 3b. In the pad, the thick portion 3a of the wiring layer 10 is a region in which wiring layers are formed on and under the heating resistor layer 9. The thin portion 3b of the wiring layer 10 is a region in which a wiring layer is formed only on the heating resistor layer 9. That is, when two or more wiring layers are formed, the total thickness of the wiring layers is defined as the thickness of the wiring layer 10. The term "thickness" as used herein refers to the thickness in the direction perpendicular to the surface of the substrate 1. A protective film 16 formed of SiN or the like and an insulating film 17 are formed at both ends of the pad.

Figure 2G:
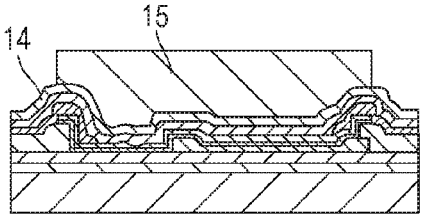
Figure 2B:
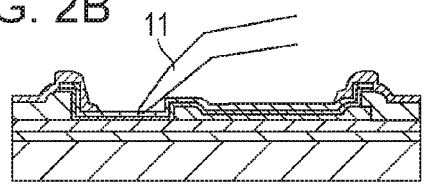

Next, as illustrated in FIG. 2B, a contact probe 11 is applied to the relatively thin portion of the wiring layer in the pad. In this manner, electrical inspection is performed on a circuit including the wiring layer. In the present invention, the wiring layer in the pad has the relatively thick portion and the relatively thin portion. The contact probe is applied to the thin portion of the wiring layer. The size of an electrical inspection mark formed by applying the contact probe is proportional to the thickness of the wiring layer. Therefore, even if an electrical inspection mark is formed by applying the contact probe to the thin portion of the wiring layer, the electrical inspection mark thus formed is small. When the heat-accumulating layers formed of $SiO_2$ or the like are formed under the wiring layer in the thin portion of the wiring layer, the heat-accumulating layers inhibit the contact probe from deeply penetrating the heat-accumulating layers.

One of the conditions for using the contact probe is the amount of overdrive, which is a parameter for sliding the probe. As the amount of overdrive increases, the amount of the wiring layer scrubbed also increases. Assuming that a typical amount of overdrive is about 50 μm, the thickness of the relatively thin portion of the wiring layer is preferably 0.1 μm or less. The thickness of the relatively thin portion of the wiring layer is preferably 0.01 μm or more from the viewpoint of wiring layer formation.

The thickness of the relatively thick portion of the wiring layer is preferably 0.2 μm or more in order to maintain the connection strength between the wiring layer and external wiring. The difference in thickness between the relatively thick portion and the relatively thin portion of the wiring layer is preferably 1.0 μm or less. This is because, when a member in which a flow channel is to be formed or the like is formed by patterning, the amount of a residual material of the member remaining in a stepped portion is intended to be reduced or eliminated as much as possible. When the difference in thickness is 1.0 μm or more, the residual material of the member may remain in the stepped portion.

In order only to reduce the size of the electrical inspection mark, the wiring layer in each pad does not need a relatively thick portion and a relatively thin portion and the wiring layer in each pad may be generally thin. However, when the wiring layer in each pad is generally thin, the voltage applied to pads tends to vary for each pad. As a result, the reliability of the liquid-ejection head decreases. When the energy-generating element is a heating resistor, the voltage for ejecting liquid is about 24 V and the wiring resistance of the wiring layer having a thin thickness thus needs to be reduced by increasing the area of the wiring layer. Consequently, the size of each pad tends to increase and thus the number of liquid-ejection-head substrates (chips) obtained per wafer tends to decrease. Therefore, the wiring layer in each pad has a thick portion and a thin portion in the present invention.

When electrical inspection is performed after pad formation, such an electrical inspection mark itself tends not to be formed. However, the electrical inspection performed after pad formation reduces the yield by the rate corresponding to pad formation. In addition, the electrical inspection performed after pad formation may involve damaging, for example, gold in a bump section and a barrier metal layer with a contact probe. This damage may cause alloying between gold and the wiring layer and reduce the reliability of the liquid-ejection head.

Figure 2H:
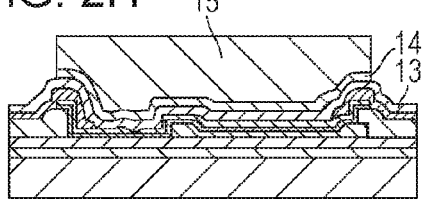
Figure 2C:
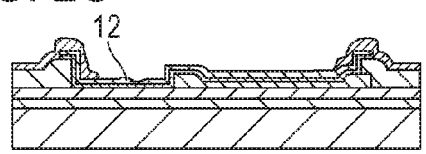

The state after application of the contact probe is illustrated in FIG. 2C. This figure indicates that an electrical inspection mark 12 is small when the electrical inspection mark 12 is formed in the thin portion of the wiring layer in the pad.

Figure 2I:
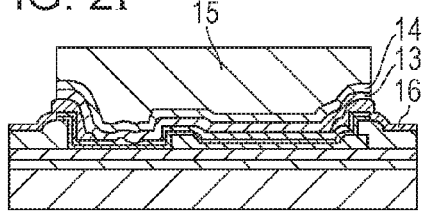
Figure 2D:
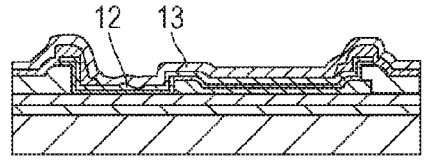

Next, as illustrated in FIG. 2D, a barrier metal layer 13 is formed so as to cover the electrical inspection mark 12. The barrier metal layer 13 is formed by depositing a predetermined thickness of, for example, titanium tungsten over the entire surface of the substrate with, for example, a vacuum deposition device. According to the method of the present invention, the electrical inspection mark 12 is small, for example, about 0.5 μm in size. The electrical inspection mark 12 does not have a significantly overhanging shape. Thus, the electrical inspection mark can be sufficiently covered by the barrier metal layer having a thickness of, for example, about 1.0 μm. When the electrical inspection mark 12 is excessively large, the electrical inspection mark 12 is not necessarily covered by the barrier metal layer. When the electrical inspection mark 12 has a significantly overhanging shape, the barrier metal layer is not necessarily formed under an overhanging portion under a protruding portion).

Figure 2J:
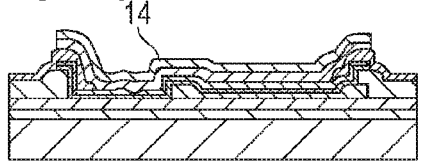
Figure 2E:
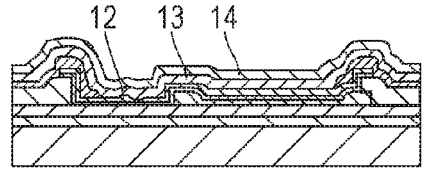

Next, as illustrated in FIG. 2E, a bump section 14 is formed on the barrier metal layer 13. The bump section 14 is formed of, for example, gold.

Figure 2K:
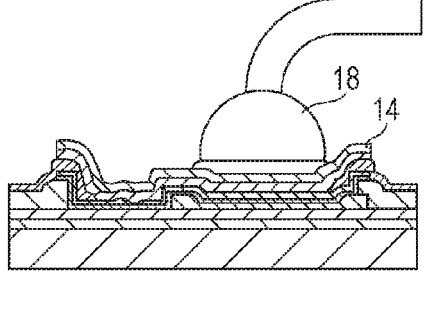
Figure 2F:
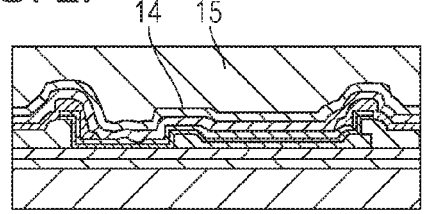

Next, as illustrated in FIG. 2F, a resist 15 is formed on the bump section 14 by, for example, spin coating. Subsequently, as illustrated in FIG. 2G, the resist 15 is patterned by, for example, photolithography.

Furthermore, as illustrated in FIG. 2H, a part of the bump section 14 is removed by using the patterned resist 15 as a mask. The part of the bump section 14 is removed by, for example, immersion for a predetermined time in a gold etchant containing a nitrogen-containing organic compound and iodine-potassium iodide. As a result, a part of the barrier metal layer 13 is exposed. The exposed barrier metal layer 13 is removed by, for example, immersion in a $H_2O_2$-based etchant for a predetermined time. As illustrated in FIG. 2I, a part of the protective film 16 is exposed.

The resist 15 is then removed by a removing solution or the like to expose the bump section 14 as illustrated in FIG. 2J. In this way, a pad is completed in which the barrier metal layer 13 with good state is formed on the electrical inspection mark 12. Even after the pad is then heated, for example, at 300° C. for one hour or more, alloying between the bump section and the wiring layer is unlikely to occur. The heat treatment at 300° C. for one hour or more may be a process performed, for example, before a mounting process for connecting the pad to external wiring.

Finally, as illustrated in FIG. 2K, the bump section 14 is connected to external wiring 18. The external wiring 18 is wiring that externally supplies electricity to the liquid-ejection-head substrate. The external wiring 18 may be connected to a part of the bump section formed above the relatively thick portion of the wiring layer in the pad. Since this part is located above the region having no electrical inspection mark, this part can withstand external forces, such as bonding load at the time of connection to the external wiring. The barrier metal layer is maintained in a good state and the reliability of the liquid-ejection head is improved accordingly.

According to the present invention, the electrical inspection mark 12 is small such that the electrical inspection mark 12 is unlikely to have an overhanging shape. If the problem of the electrical inspection mark 12 persists, a lower region (i.e., a region close to the substrate) of the electrical inspection mark 12 may be filled with a filling material. In particular, when the electrical inspection mark overhangs, a region under the overhanging part may be filled with a filling material. For example, in the state illustrated in FIG. 2C, a thermoplastic resin functioning as a filling material is applied to the substrate. Examples of the thermoplastic resin include polyether amide and acrylic resins. The filling material may be applied under reduced pressure. The reduced pressure is preferably 20 kPa or less. Under reduced pressure, the filling material can be appropriately applied. Subsequently, an excess filling material is removed by, for example, dry etching so that the filling material is left under the overhanging part of the electrical inspection mark 12. The subsequent processes are the same as the processes in FIGS. 2D to 2K for producing the liquid-ejection-head substrate. When the region under the overhanging part of the electrical inspection mark 12 is filled with the filling material, the reliability of the liquid-ejection head further improves. When polyether amide is used as a thermoplastic resin, which is a filling material, polyether amide can be also used as an adhesive layer that enables the adhesion between the substrate and the member having a flow channel and the like.

One of the methods for further inhibiting formation of the electrical inspection mark 12 is a method of using a metal layer. Specifically, a metal layer is formed on the wiring layer in the state illustrated in FIG. 2A. This metal layer has higher hardness than the wiring layer. Examples of materials of the metal layer include Ta, Ru, and Nb. The Vickers hardness of the metal layer is preferably 870 MPa or more. The electrical inspection is performed by applying the contact probe to this metal layer. According to this method, the contact probe is brought into direct contact with the metal layer having a high hardness so that the contact probe is in indirect contact with the wiring layer with the metal layer therebetween. This method can further reduce formation of the electrical inspection mark 12. The metal layer may be formed at least on a part to which the contact probe is applied. Alternatively, the metal layer may be formed even on the protective film 16 to further reduce possibility of alloying. After the electrical inspection, the liquid-ejection-head substrate is produced by the same processes as in FIGS. 2C to 2K.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-021653 filed Feb. 5, 2015, which is hereby incorporated by reference herein in its entirety.

What is claimed is:

1. A method for producing a liquid-ejection-head substrate including a substrate, an energy-generating element provided on the substrate and configured to energize liquid and cause ejection of the liquid, and a pad provided on the substrate and electrically connected to the energy-generating element, the method comprising:

providing the substrate having the energy-generating element and the pad, the pad including a wiring layer, the wiring layer having a relatively thick portion and a relatively thin portion; and performing electrical inspection by applying a contact probe only to the relatively thin portion of the wiring layer.

2. The method for producing a liquid-ejection-head substrate according to claim 1, wherein the relatively thin portion of the wiring layer has a thickness of 0.1 µm or less.

3. The method for producing a liquid-ejection-head substrate according to claim 1, wherein the relatively thick portion of the wiring layer has a thickness of 0.2 µm or more.

4. The method for producing a liquid-ejection-head substrate according to claim 1, wherein the relatively thin portion of the wiring layer and the relatively thick portion of the wiring layer have a difference in thickness of 1.0 µm or less.

5. The method for producing a liquid-ejection-head substrate according to claim 1, further comprising forming a bump section above the wiring layer after performing the electrical inspection.

6. The method for producing a liquid-ejection-head substrate according to claim 5, further comprising connecting external wiring to a part of the bump section formed above the relatively thick portion of the wiring layer, the external wiring externally supplying electricity to the liquid-ejection-head substrate.

7. The method for producing a liquid-ejection-head substrate according to claim 1, further comprising filling a lower region of an electrical inspection mark with a filling material, the electrical inspection mark being formed by the electrical inspection.

8. The method for producing a liquid-ejection-head substrate according to claim 7, wherein the filling material is a thermoplastic resin.

9. The method for producing a liquid-ejection-head substrate according to claim 1, further comprising providing a metal layer on the relatively thin portion of the wiring layer, wherein the electrical inspection is performed by bringing the contact probe into direct contact with the metal layer.

10. The method for producing a liquid-ejection-head substrate according to claim 9, wherein the metal layer contains at least one of Ta, Ru, and Nb.

11. The method for producing a liquid-ejection-head substrate according to claim 1, wherein the wiring layer is formed of aluminum.

12. A liquid-ejection-head substrate comprising:
a substrate;
an energy-generating element provided on the substrate and configured to energize liquid and cause ejection of the liquid; and
a pad provided on the substrate and electrically connected to the energy-generating element,
wherein
the pad includes a wiring layer,
the wiring layer has a relatively thick portion and a relatively thin portion, and
the relatively thin portion of the wiring layer has an electrical inspection mark formed by application of a contact probe.

13. The liquid-ejection-head substrate according to claim 12, further comprising a bump section formed above the wiring layer, wherein a part of the bump section formed above the relatively thick portion of the wiring layer is connected to external wiring that externally supplies electricity to the liquid-ejection-head substrate.

* * * * *